US008362488B2

(12) United States Patent
Chaug et al.

(10) Patent No.: US 8,362,488 B2
(45) Date of Patent: Jan. 29, 2013

(54) FLEXIBLE BACKPLANE AND METHODS FOR ITS MANUFACTURE

(75) Inventors: Yi-Shung Chaug, Cupertino, CA (US); Ching-Shon Ho, Atherton, CA (US)

(73) Assignee: SiPix Imaging, Inc., Fremont, CA (US)

( * ) Notice: Subject to any disclaimer, the term of this patent is extended or adjusted under 35 U.S.C. 154(b) by 318 days.

(21) Appl. No.: 11/853,192

(22) Filed: Sep. 11, 2007

(65) Prior Publication Data

US 2008/0061300 A1 Mar. 13, 2008

Related U.S. Application Data

(60) Provisional application No. 60/844,194, filed on Sep. 12, 2006.

(51) Int. Cl.
*H01L 27/14* (2006.01)
(52) U.S. Cl. ............... 257/72; 257/E27.13; 438/584
(58) Field of Classification Search ............ 257/72, 257/E27.13; 438/584
See application file for complete search history.

(56) References Cited

U.S. PATENT DOCUMENTS

| | | | | |
|---|---|---|---|---|
| 4,126,854 | A | | 11/1978 | Sheridon |
| 5,106,311 | A | * | 4/1992 | Yodogawa et al. ............ 439/77 |
| 7,417,867 | B1 | * | 8/2008 | Matsuda et al. ............ 361/752 |
| 7,880,958 | B2 | | 2/2011 | Zang et al. |
| 2002/0095007 | A1 | * | 7/2002 | Larock et al. ............ 524/310 |
| 2005/0024353 | A1 | * | 2/2005 | Amundson et al. ........... 345/204 |
| 2005/0116637 | A1 | * | 6/2005 | Yoshizawa .................. 313/512 |
| 2005/0173811 | A1 | * | 8/2005 | Kinsman ..................... 257/784 |
| 2005/0275923 | A1 | * | 12/2005 | Park ........................... 359/270 |
| 2006/0132428 | A1 | * | 6/2006 | Liu et al. .................... 345/107 |
| 2007/0070030 | A1 | * | 3/2007 | Zang et al. ................. 345/107 |
| 2008/0024060 | A1 | * | 1/2008 | Jonnalagadda et al. ...... 313/509 |

OTHER PUBLICATIONS

Allen, K. Electrophoretics Fulfilled. *Emerging Displays Review: Emerging Display Technologies, Monthly Report*—Oct. 2003, 9-14.
Bardsley, J.N. & Pinnel, M.R. (Nov. 2004) Microcup™ Electrophoretic Displays. *USDC Flexible Display Report*, 3.1.2. pp. 3-12-3-16.
Chaug, Y.S., Haubrich, J.E., Sereda, M. and Liang, R.C. (Apr. 2004). Roll-to-Roll Processes for the Manufacturing of Patterned Conductive Electrodes on Flexible Substrates. *Mat. Res. Soc. Symp. Proc.*, vol. 814, I9.6.1.
Chen, S.M. (Jul. 2003) The Applications for the Revolutionary Electronic Paper Technology. *OPTO News & Letters*, 102, 37-41.
Chen, S.M. (May 2003) The New Application and the Dynamics of Companies. *TRI.* 1-10.
Chung, J., Hou, J., Wang, W., Chu, L.Y., Yao, W., & Liang, R.C. (Dec. 2003). Microcup® Electrophoretic Displays, Grayscale and Color Rendition. *IDW*, AMD2/EP1-2, 243-246.
Ho, Andrew. *Embedding e-Paper in Smart Cards, Pricing Labels & Indicators.* Presentation conducted at Smart Paper Conference Nov. 15-16, 2006, Atlanta, GA.
Ho, C.,& Liang, R.C. (Dec. 2003). *Microcup® Electronic Paper by Roll-to-Roll Manufacturing Processes.* Presentation conducted at FEG, Nei-Li, Taiwan.
Ho, Candice. (Feb. 1, 2005) *Microcupt® Electronic Paper Device and Applicaiton.* Presentation conducted at USDC 4th Annual Flexible Display Conference 2005.

(Continued)

*Primary Examiner* — Thao Le
*Assistant Examiner* — Matthew Gordon
(74) *Attorney, Agent, or Firm* — Perkins Coie LLP.

(57) ABSTRACT

The present invention is directed to a flexible backplane for direct drive display devices and methods for its manufacture. The flexible backplane has many advantages. Because there is no need for a polyimide layer and only one layer of metal foil is used, the backplanes may be manufactured at a relatively low cost.

11 Claims, 6 Drawing Sheets

OTHER PUBLICATIONS

Hou, J., Chen, Y., Li, Y., Weng, X., Li, H. And Pereira, C. (May 2004). Reliability and Performance of Flexible Electrophoretic Displays by Roll-to-Roll Manufacturing Processes. *SID Digest*, 32.3, 1066-1069.

Lee, H., & Liang, R.C. (Jun. 2003) SiPix Microcup® Electronic Paper—An Introduction. *Advanced Display*, Issue 37, 4-9.

Liang, R.C. (Feb. 2003) *Microcup® Electrophoretic and Liquid Crystal Displays by Roll-to-Roll Manufacturing Processes*. Presentation conducted at the Flexible Microelectronics & Displays Conference of U.S. Display Consortium, Phoenix, Arizona, USA.

Liang, R.C. (Apr. 2004). *Microcup Electronic Paper by Roll-to-Roll Manufacturing Process*. Presentation at the Flexible Displays & Electronics 2004 of Intertech, San Fransisco, California, USA.

Liang, R.C. (Oct. 2004) *Flexible and Roll-able Displays/Electronic Paper—A Technology Overview*. Paper presented at the METS 2004 Conference in Taipie, Taiwan.

Liang, R.C., & Tseng, S. (Feb. 2003). *Microcup® LCD, A New Type of Dispersed LCD by A Roll-to-Roll Manufacturing Process*. Paper presented at the IDMC, Taipei, Taiwan.

Liang, R.C., (Feb. 2005) *Flexible and Roll-able Displays/Electronic Paper—A Brief Technology Overview*. Flexible Display Forum, 2005, Taiwan.

Liang, R.C., Hou, J., & Zang, H.M. (Dec. 2002) Microcup Electrophoretic Displays by Roll-to-Roll Manufacturing Processes. *IDW*, EP2-2, 1337-1340.

Liang, R.C., Hou, J., Chung, J., Wang, X., Pereira, C., & Chen, Y. (2003). Microcup® Active and Passive Matrix Electrophoretic Displays by a Roll-to-Roll Manufacturing Processes. *SID Digest*, 20.1.

Liang, R.C., Hou, J., Zang, H.M., & Chung, J. (Feb. 2003). *Passive Matrix Microcup® Electrophoretic Displays*. Paper presented at the IDMC, Taipei, Taiwan.

Liang, R.C., Hou, J., Zang, H.M., Chung, J., & Tseng, S. (2003). Microcup® displays : Electronic Paper by Roll-to-Roll Manufacturing Processes. *Journal of the SID*, 11(4), 621-628.

Liang, R.C., Zang, H.M., Wang, X., Chung, J. & Lee, H., (Jun./Jul. 2004) << Format Flexible Microcup® Electronic Paper by Roll-to-Roll Manufacturing Process >>, Presentation conducted at the 14th FPD Manufacturing Technology EXPO & Conference.

Nikkei Microdevices. (Dec. 2002) Newly-Developed Color Electronic Paper Promises—Unbeatable Production Efficiency. *Nikkei Microdevices*, 3. (in Japanese, with English translation).

Wang, X., Kiluk, S., Chang, C., & Liang, R.C. (Feb.2004). Mirocup® Electronic Paper and the Converting Processes. *ASID*, 10.1.2-26, 396-399, Nanjing, China.

Wang, X., Kiluk, S., Chang, C., & Liang, R.C., (Jun. 2004) Microcup® Electronic Paper and the Converting Processes. *Advanced Display*, Issue 43, 48-51 (in Chinese, with English abstract).

Wang, X., Li, P., Sodhi, D., Xu, T. and Bruner, S. et al., (Feb. 2006) *Inkjet Fabrication of Multi-Color Microcup® Electrophorectic Display*. the Flexible Microelectronics & Displays Conference of U.S. Display Consortium.

Wang, X., Zang, HM., and Li, P. (Jun. 2006) Roll-to-Roll Manufacturing Process for Full Color Electrophoretic film. *SID Digest*, 00pp. 1587-1589.

Zang, H.M, Hwang, J.J., Gu, H., Hou, J., Weng, X., Chen, Y., et al. (Jan. 2004). Threshold and Grayscale Stability of Microcup® Electronic Paper. *Proceeding of SPIE—IS&T Electronic Imaging, SPIE* vol. 5289, 102-108.

Zang, H.M. & Hou, Jack, (Feb. 2005) *Flexible Microcup® EPD by RTR Process*. Presentation conducted at $2^{nd}$ Annual Paper-Like Displays Conference, Feb. 9-11, 2005, St. Pete Beach, Florida.

Zang, H.M. (Oct. 2003). *Microcup® Electronic Paper by Roll-to-Roll Manufacturing Processes*. Presentation conducted at the Advisory Board Meeting, Bowling Green State University, Ohio, USA.

Zang, H.M. (Feb. 2004). *Microcup Electronic Paper*. Presentation conducted at the Displays & Microelectronics Conference of U.S. Display Consortium, Phoenix, Arizona, USA.

Zang, H.M., & Liang, R.C. (2003) Microcup Electronic Paper by Roll-to-Roll Manufacturing Processes. *The Spectrum*, 16(2), 16-21.

Zang, HM., *Monochrome and Area Color Microcup®EPDs by Roll-to-Roll Manufacturing Process*. Presentation conducted at the Forth Organic Electronics Conference and Exhibition (OEC-06), Sep. 25-27, 2006, Frankfurt, Germany.

Zang, HM., Wang, W., Sun, C., Gu, H., and Chen, Y. (May 2006) Monochrome and Area Color Microcup® EPDs by Roll-to-Roll Manufacturing Processes. *ICIS ' 06 International Congress of Imaging Science Final Program and Proceedings*, pp. 362-365.

Zang, Hongmei. (Feb. 2007) *Developms in Microcup® Flexible Displays*. Presidentaiton conducted at the 6th Annual Flexible Display and Microelectronics Conference, Phoenix, AZ Feb. 6-8.

* cited by examiner

FLEXIBLE BACKPLANE AND METHODS FOR ITS MANUFACTURE

This application claims the benefit of U.S. Provisional Application No. 60/844,194, filed Sep. 12, 2006; which is incorporated herein by reference in its entirety.

FIELD OF THE INVENTION

This invention is directed to a flexible backplane for a direct drive display device and methods of its manufacture.

BACKGROUND OF INVENTION

A direct drive display device usually comprises a layer of display cells sandwiched between two electrode layers. On the viewing side of the display device, a transparent conductive coating on a plastic film is typically used as the front electrode. The non-viewing side comprises a backplane which has patterned segment electrodes and electric circuits. In the backplane structure, there are electric wires which electrically connect the segment electrodes (through conductive via holes) to connecting terminals which are then linked to a driving mechanism. The driving mechanism drives the display device.

There are several methods for fabricating the backplane. However each has its short-comings.

One of the methods involves the use of two copper foils laminated on each side of a polyimide substrate layer. Segment electrodes are formed from one of the copper foils by, for example, photolithography while blind via holes are formed through the other copper foil and the polyimide layer. Blind via holes (which are made conductive by metallization) are positioned corresponding to the segment electrodes on the opposite side. The electric wires (or electric lead lines) and connecting terminals for inter-connection are formed from the copper foil having the via holes. The segment electrodes are connected electrically to connecting terminals by the wires through the conductive via holes. The connecting terminals may be a Goldfinger type with a high density pitch. A chip-on-film (COF) may be bonded directly on the connecting terminals, utilizing anisotropic conductive film (ACF) bonding. The COF may also be built in the flexible backplane. This method simplifies the inter-connection between the backplane to other electronic components. However, the cost for such a flexible backplane is high due to the use of the polyimide substrate and the complexity of the method.

Printed flexible circuit is another method which utilizes a heat stabilized PET film as a substrate film on which via holes are drilled in a pre-defined area. Conductive paste is printed on one side of the PET substrate to form segment electrodes. Electric wires (or electric lead lines) are printed on the other side of the PET substrate and are electrically connected to the segment electrodes on the other side of the PET substrate, through the conductive via holes. Due to technical limitation of the conductive paste printing, a high density connecting terminal is not suitable to be printed on the PET substrate. As a result, an extra flexible inter-connector having high density pitch connecting terminals is needed which may be tape bonded electrically to the conductive paste printed wires on the PET substrate. The bonding may also need additional mechanical support. The via holes are usually visible from the viewing side of the display device when this type of backplane is used.

A further alternative method involves the use of a heat stabilized PET and a copper foil which is laminated on one side of the PET substrate. The segment electrodes are formed from the copper foil by photolithography. Blind via holes through the PET substrate are formed on the other side of the PET substrate, positioned corresponding to the segment electrodes on the opposite side. Conductive paste is used to form electric wirings on the PET surface, i.e., the opposite side of the copper foil. The electric wires on the PET surface are electrically connected to the segment electrodes formed from the copper foil through the conductive via holes. An extra flexible inter-connector is also needed in this method.

SUMMARY OF THE INVENTION

The present invention is directed to a flexible backplane for direct drive display devices and methods for its manufacture. The backplane and methods do not involve the use of a polyimide layer.

In one aspect of the invention, the backplane comprises a segment electrode, a connecting terminal, a wire and at least one conductive via hole, wherein said segment electrode and said connecting terminal are connected through said wire and said conductive via hole(s).

In one embodiment of the invention, the segment electrode and the connecting terminal are formed from a metal foil on a plastic film substrate and the wire is formed on the opposite side of the plastic film substrate and each of the segment electrode and the connecting terminal is connected to the wire through a conductive via hole. Such a backplane may be manufactured by     a) depositing a metal foil on one side of a plastic film substrate;

b) forming a segment electrode and a connecting terminal on said metal foil;

c) forming a wire on the side of said plastic film substrate opposite from the metal foil;

d) forming conductive via holes to connect each of said segment electrode and said connecting terminal to said wire through a conductive via hole.

In another embodiment of the invention, the wire and the connecting terminal are formed from a metal foil on a plastic film substrate and the segment electrode is formed on the opposite side of the plastic film substrate and the segment electrode is connected to said connecting terminal through the wire and a conductive via hole. Such a backplane may be manufactured by     a) depositing a metal foil on one side of a plastic film substrate;

b) forming a wire and a connecting terminal on said metal foil;

c) forming a segment electrode on the side of said plastic film substrate opposite from the metal foil; and     d) forming a conductive via hole to connect said segment electrode to said connecting terminal through the wire and said conductive via hole.

The flexible backplane of the present invention has many advantages. First of all, because no polyimide layer is needed and only one layer of metal foil is used, the backplanes may be prepared at a relatively low cost. Secondly, the connecting terminals may be a Goldfinger type with a high density pitch. Furthermore, a chip-on-film (COF) may be directly bonded on the connecting terminals by ACF bonding. As a result, the inter-connection between the backplane and other electronic components is simplified.

DETAILED DESCRIPTION OF THE INVENTION

The present invention is directed to a flexible backplane which is suitable for direct drive display devices and methods for its manufacture. The term "display device" refers to display devices such as electrophoretic display, liquid crystal display, twisting ball display (see, for example, U.S. Pat. No. 4,126,854), electrodeposition display, electrochromic display or the like. Broadly speaking, the present methods are applicable to any direct drive display devices the operation of which is driven by an electrical field, especially by two opposing electrode plates one of which may comprise segment electrodes.

The display device comprises a layer of display cells which are filled with a display fluid. Depending on the type of display device, the display fluid may be an electrophoretic composition, a liquid crystal composition, a twisting ball composition, an electrodeposition composition, an electrochromic composition or the like.

Figure 1:
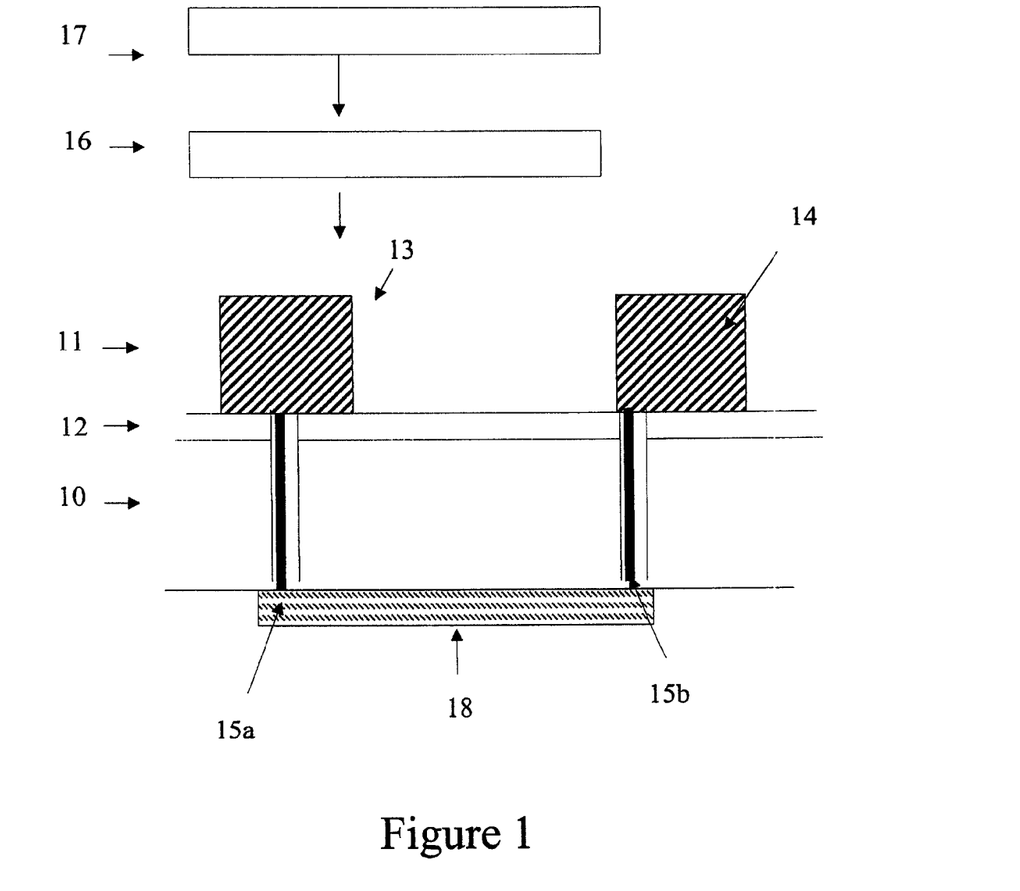
FIG. 1 is a cross-section view of a flexible backplane of the present invention.

FIG. 1 is a cross-section view of a flexible backplane of one aspect of the invention. In this backplane, no polyimide layer is needed. The backplane has a plastic film substrate (10) and one side of the film substrate is laminated with a metal foil (11). The lamination may be accomplished with an adhesive (12).

The plastic substrate film may be formed from a material such as PET (polyethylene terephthalate), PEN (polyethylene napthalate), PC (polycarbonate) or PI (polyimide). A heat stabilized PET is usually preferred based on the cost consideration.

The metal foil may be formed from a conductive material such as Cu, Au, Al, Ag, Ni or an alloy thereof. A copper foil will be favorable for the formation of the connecting terminals due to the consideration of ACF bonding.

The segment electrode (13) and the connecting terminal (14) are formed from the metal foil (11). The segment electrode and the connecting terminal may be formed by etching the metal foil photolithographically. Such a process comprises the steps of dry film lamination, exposure, developing, etching and stripping. These steps may be carried out in a roll-to-roll format.

The term "connecting terminal", throughout this application, refers to the "terminal" of a wire or electric lead line which interconnects a segment electrode and a driving mechanism.

The connecting terminal, in this case, may be the Goldfinger type with a high density pitch. A chip-on-film may be bonded directly on the output connector by ACF bonding.

Via holes, 15a and 15b, are drilled through the plastic substrate film from the side opposite of the metal foil and they are positioned corresponding to the positions of the segment electrode (13) and connecting terminal (14), respectively.

Laser drilling is preferably used for the formation of blind via hole and laser ablation removes the material of the plastic film and the adhesive material inside the via hole but not the metal foil on top of via hole. This blind via process will not generate via hole on the segment electrode, and therefore, the via hole will not be visible from the viewing side of the display device utilizing the backplane prepared from this method. The via hole is made conductive by printing a conductive paste to fill the inner space of the blind via hole.

Conductive paste is printed on the substrate film on the opposite side of the metal foil to form a wire (or electric lead line) (18). The wire (18) connects to the segment electrode (13) through the via hole (15a) and the connecting terminal (14) through the via hole (15b).

For simplicity and clarity, only one segment electrode is shown in FIG. 1. In practice, a backplane may have multiple segment electrodes. While not specifically demonstrated in FIG. 1, it is understood that all segment electrodes may have the same connection pattern as shown in the figure. In other words, each segment electrode is individually connected to a connecting terminal by a wire through two via holes.

Figure 2:
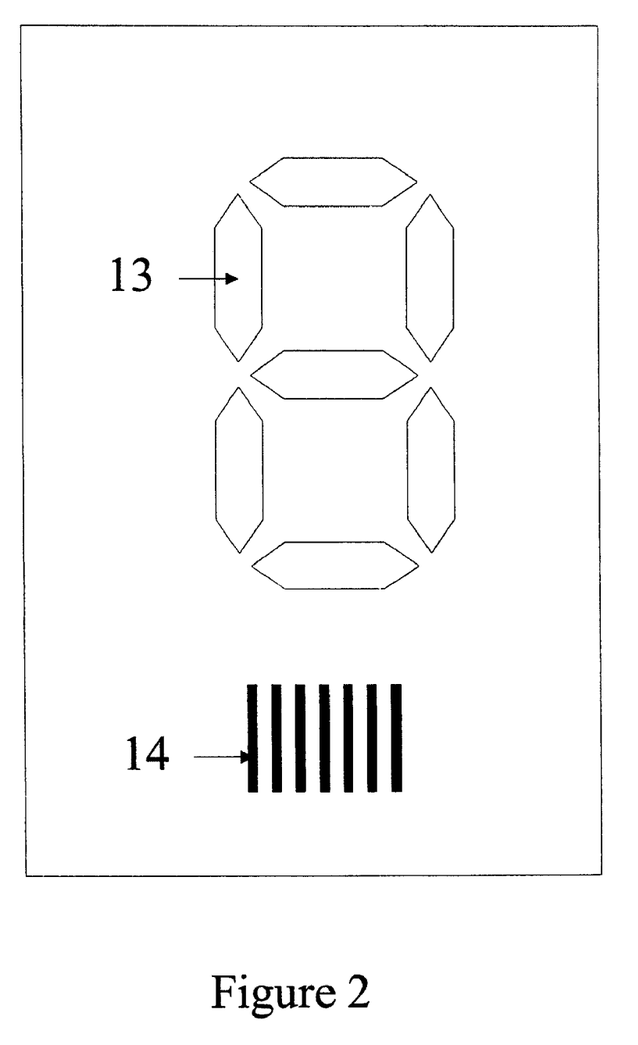
FIG. 2 is the top view of a metal film in the backplane of the present invention.

FIG. 2 is the top view of the metal foil (11) showing a pattern of seven segment electrodes (13) and the seven corresponding connecting terminals (14). The metal material in areas not having the segment electrodes and the connecting terminals is removed in the photolithography process.

Figure 3:
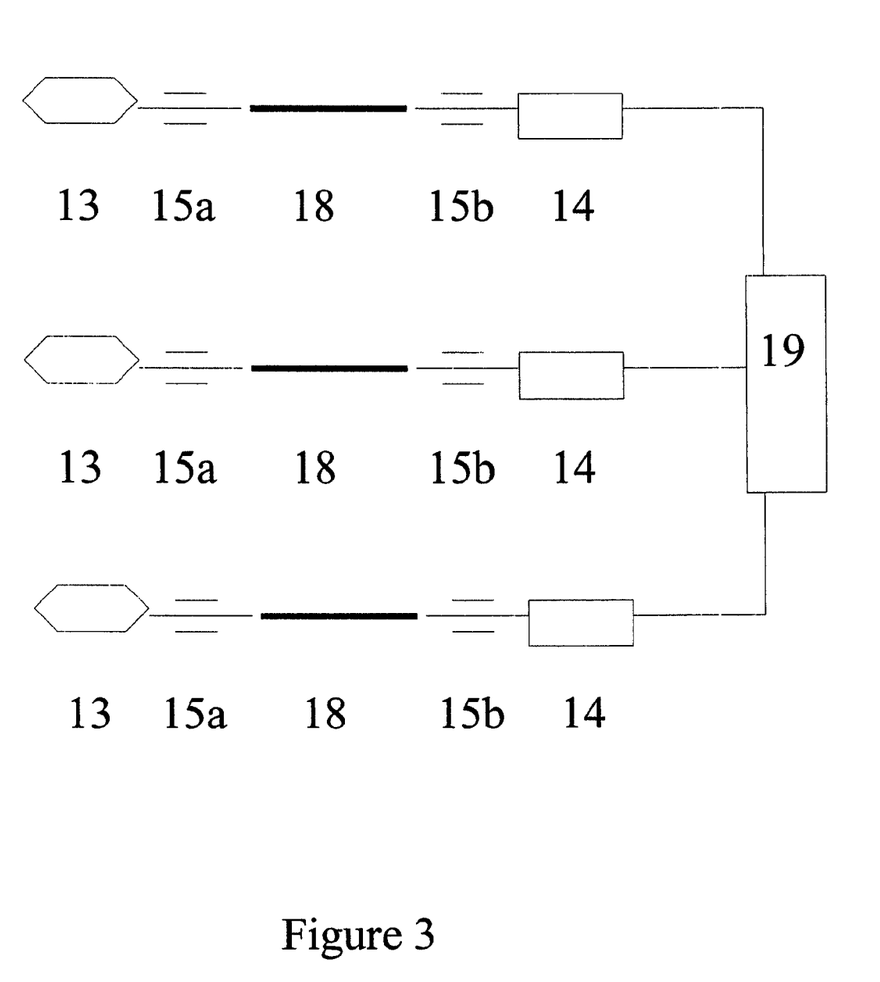
FIG. 3 illustrates how segment electrodes and the connecting terminals formed from the same metal foil are connected.

FIG. 3 depicts how a series of segment electrodes (13) are electrically connected to the connecting terminals (14) by the wires (18) through the conductive via holes (15a and 15b). All of the connecting terminals are then linked to a driving mechanism (19).

When a backplane manufactured from the present invention is laminated onto a layer of display cells (16) as shown in FIG. 1, the layer of display cells will only cover the "active" area where the segment electrodes are present. The layer of the display cells will not cover the "inactive area" where the connecting terminals are present. A common electrode layer (17) is laminated over the other side of the display cell layer (16) as shown, to complete the display assembly.

Figure 4:
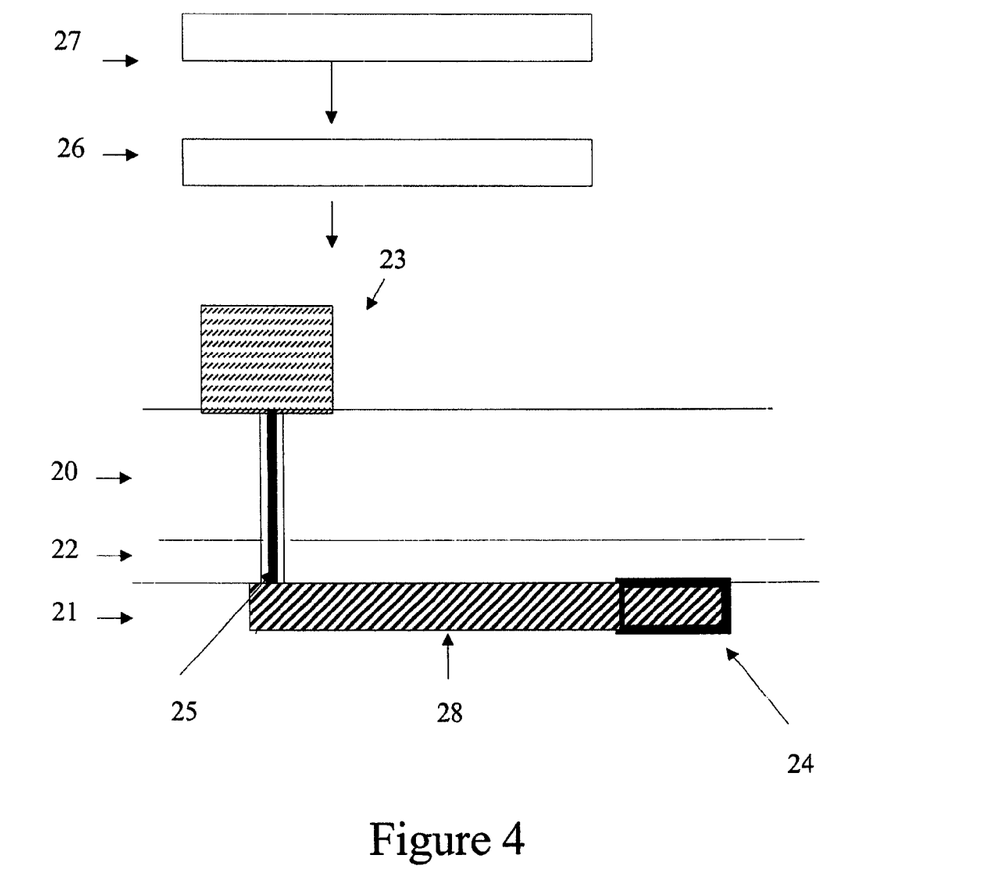
FIG. 4 is a cross-section view of the alternative backplane of the invention.
Figure 5:
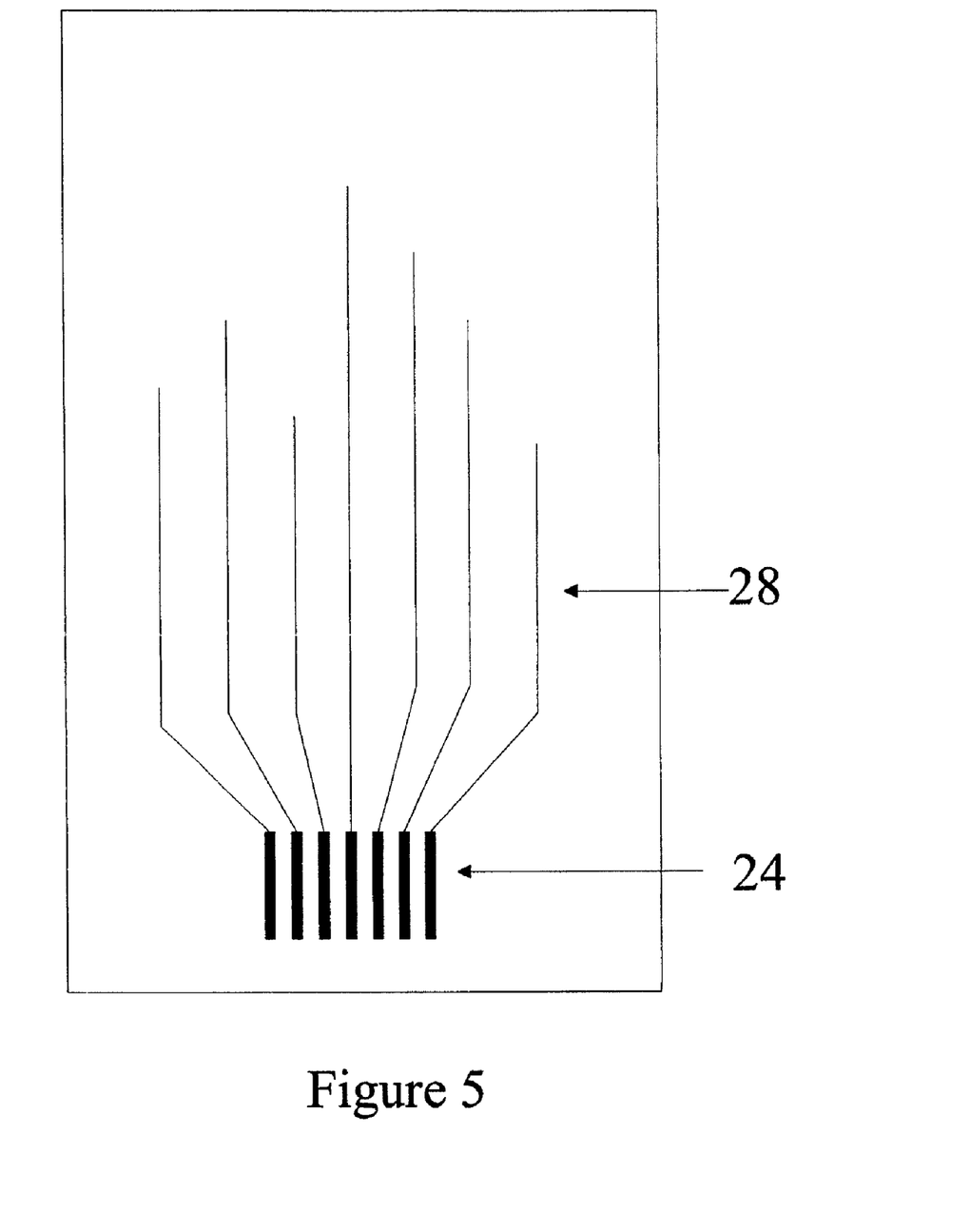
FIG. 5 is the top view of a metal film in an alternative backplane of the present invention.

FIG. 4 is a cross-section view of an alternative flexible backplane structure of the invention. In this structure, no polyimide layer is needed and the connecting terminals and the wires (or electric lead lines) are formed from the same metal foil (see FIG. 5). On the metal foil, the metal material in areas not having the wires (28) and connecting terminals (24) is removed during the photolithography process.

The structure has a plastic film substrate (20) and one side of the film substrate is laminated with a metal foil (21). The lamination may be accomplished with an adhesive (22).

The suitable materials for the plastic substrate film and the metal foil are the same as those described above.

A wire (or electric lead line) (28) and a connecting terminal (24) are formed from the metal foil (21) by, for example, photolithography as described above.

The connecting terminal may be the Goldfinger type with a high density pitch. A chip-on-film may be bonded directly on the connecting terminal by ACF bonding.

A via hole (25) is drilled through the plastic substrate film from the side opposite of the metal foil and the via hole is positioned at the starting point of the wire (28).

Laser drilling is preferably used for the formation of the blind via hole and laser ablation removes the material of the plastic film and the adhesive material inside the via hole, but not the metal foil. The via hole is made conductive by printing a conductive paste to fill the inner space of the via hole.

A conductive paste is printed on the substrate film on the opposite side of the metal foil to form a segment electrode (23) which is electrically connected to the connecting terminal (24) by the wire (28), through the conductive via hole (25).

Figure 6:
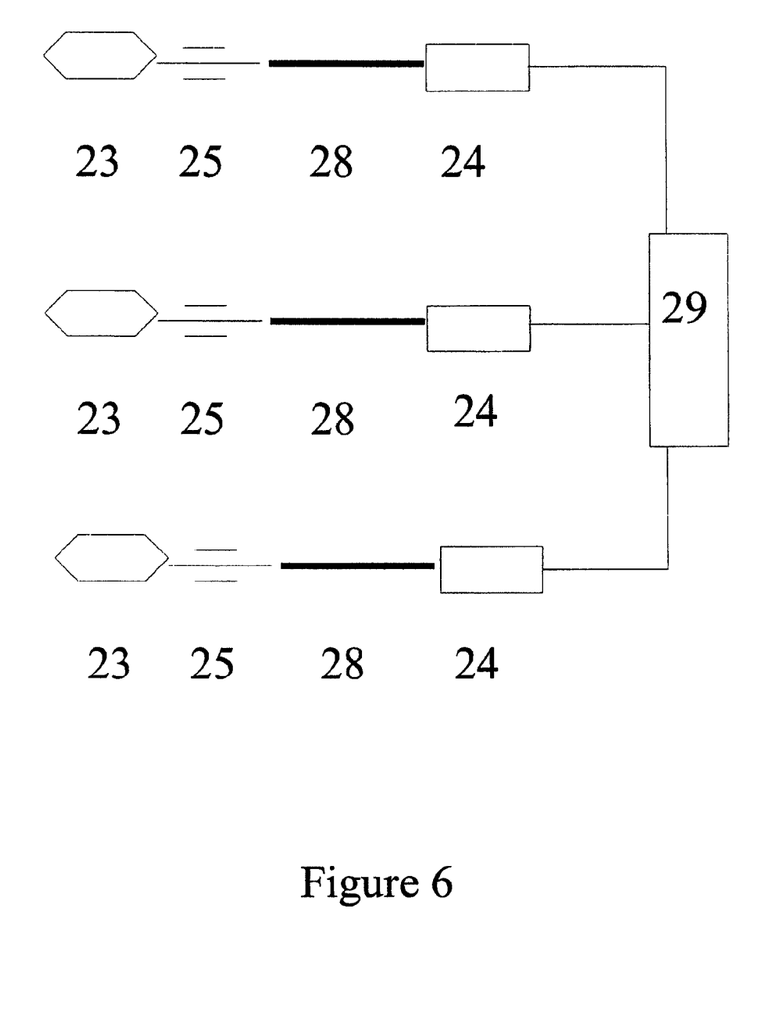
FIG. 6 illustrates how segment electrodes and the connecting terminals are connected.

For clarity and simplicity, only one segment electrode is shown in FIG. 4. In practice, there may be multiple segment electrodes in a backplane. It is understood that all segment electrodes may have the same connection pattern as shown in FIG. 4. In other words, each segment electrode (23) is individually connected to a specific connecting terminal (24) by a wire (28) through one via hole (25). FIG. 6 illustrates how a series of segment electrodes (23) are electrically connected to the connecting terminals (24) by the wires (28) through the conductive via holes (25). All of the connecting terminals (24) are then linked to a driving mechanism (29).

When a backplane is laminated onto a layer of display cells (26) as shown in FIG. 4, the layer of display cells will cover the area where the segment electrodes are present. A common electrode layer (27) is laminated over the other side of the display cell layer (26) as shown, to complete the display assembly.

A protective layer (not shown) may be coated over the surface of the segment electrodes on the backplane. The protective layer may be formed from a composition comprising a polar oligomeric or polymeric material having a glass transition temperature below about 100° C. and the resulting layer has an average crosslinking density of below about 1 crosslink point per 80 molecular weight. The protective layer composition is first applied to the surface of the segment electrodes on the backplane, followed by curing the composition. A smooth surface of the segment electrodes on the backplane may be achieved this way. Alternatively, a release layer may be placed (preferably with pressure) over the coated protective layer composition before curing to ensure an even distribution of the composition on the backplane surface and the release layer can be removed after curing.

There may be line gaps between segment electrodes and small crevices of the via holes in the segment electrodes. The protective layer composition in the form of a liquid (before curing) may reach deep gaps or small crevices on the surface of the backplane. This feature, in combination with the low resistivity of the protective layer, allows the electrical field created by the adjacent electrodes to reach the display fluid right above the filled gaps. As a result, the switching performance of the gap areas could be similar to that of the areas with segment electrodes. Since the gap areas are no longer inactive during switching, sharper and cleaner images can be achieved.

Further optionally, a barrier film may be disposed on the backplane on the opposite side of the segment electrodes. This may be accomplished by lamination using a thermosetting adhesive, UV curable adhesive or pressure sensitive adhesive.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, materials, compositions, processes, process step or steps, to the objective, spirit and scope of the present invention. All such modifications are intended to be within the scope of the claims appended hereto.

What is claimed is:

1. A backplane for a direct drive display device, which comprises:

(i) a plastic film substrate, one side of said substrate comprises an active area and an inactive area, wherein said active area comprises at least one segment electrode and said inactive area comprises at least one connecting terminal, and the other side of said substrate comprises at least a wire; and (ii) conductive via holes through which said segment electrode and said connecting terminal are individually connected to said wire, wherein said active area, not said inactive area, is covered by a layer of display cells, and only the connecting terminal is directly linked to a driving mechanism, and gaps between said segment electrodes and crevices of the via holes are covered by a protective layer formed from a composition comprising a polar oligomeric or polymeric material having a glass transition temperature below about 100° C. and the resulting layer has an average crosslinking density of below about 1 crosslink point per 80 molecular weight.

2. The backplane of claim 1 wherein said segment electrode and said connecting terminal are formed from a metal foil.

3. The backplane of claim 1 wherein said connecting terminal is the type of a high density pitch.

4. The backplane of claim 2 wherein said metal foil is a copper foil.

5. The backplane of claim 1 wherein a barrier layer is disposed on the side of said plastic film substrate comprising the wire.

6. The backplane of claim 5 wherein said barrier layer is formed from a thermosetting adhesive, UV curable adhesive or pressure sensitive adhesive.

7. A method for manufacturing a backplane of claim 2, which method comprises:
   a) depositing the metal foil on one side of the plastic film substrate;
   b) forming the segment electrode and the connecting terminal on said metal foil;
   c) applying the composition to reach the gaps and crevices and curing the composition to form the protective layer;
   d) forming the wire on the side of said plastic film substrate opposite from the metal foil;
   e) forming said conductive via holes; and
   f) connecting said segment electrode and said connecting terminal individually to said wire through said conductive via holes.

8. The method of claim 7 further comprising connecting said connecting terminal to a driving mechanism.

9. The method of claim 7 wherein said wire is formed by printing of a conductive paste.

10. The method of claim 7 wherein said segment electrode and said connecting terminal are formed by photolithography of said metal foil.

11. A direct drive display device, comprising
   a) a common electrode,
   b) the backplane of claim 1; and
   c) the layer of display cells sandwiched between the common electrode and the backplane.

* * * * *